(12) United States Patent
Hwang

(10) Patent No.: US 9,989,609 B2
(45) Date of Patent: Jun. 5, 2018

(54) METHOD AND APPARATUS FOR ADJUSTING THE PARAMETERS OF A MAGNETIC RESONANCE IMAGE

(71) Applicant: INDUSTRY-ACADEMIC COOPERATION FOUNDATION, YONSEI UNIVERSITY, Seoul (KR)

(72) Inventor: Do Sik Hwang, Seoul (KR)

(73) Assignee: INDUSTRY-ACADEMIC FOUNDATION, YONSEI UNIVERSITY, Seoul (KR)

(*) Notice: Subject to any disclaimer, the term of this patent is extended or adjusted under 35 U.S.C. 154(b) by 565 days.

(21) Appl. No.: 14/677,758

(22) Filed: Apr. 2, 2015

(65) Prior Publication Data

US 2015/0285886 A1    Oct. 8, 2015

(30) Foreign Application Priority Data

Apr. 3, 2014 (KR) .................. 10-2014-0040128
Apr. 11, 2014 (KR) .................. 10-2014-0043299

(51) Int. Cl.
*G01V 3/00* (2006.01)
*G01R 33/54* (2006.01)
*G01R 33/50* (2006.01)

(52) U.S. Cl.
CPC ............ *G01R 33/546* (2013.01); *G01R 33/50* (2013.01)

(58) Field of Classification Search
CPC ........... A61B 5/055; A61B 6/00; A61B 5/004; A61B 5/02; A61B 5/029; A61B 5/72; A61B 5/721; A61B 6/481; A61B 5/0035; A61B 2017/00004; A61B 2560/0223; A61B 5/0033; A61B 5/0042; A61B 5/0263; A61B 5/02755; A61B 5/0402; A61B 5/201; A61B 5/4881; G01R 33/5601; G01R 33/50; G01R 33/56; G01R 33/5608; G01R 33/5602; G01R 33/5611; G01R 33/4828; G01R 33/5616; G01R 33/56341; G01R 33/5617; G01R 33/381; G01R 33/445; G01R 33/4824; G01R 33/54; G01R 33/543; G01R 33/5605; G01R 33/561; G01R 33/56509; G01R 33/483; G01R 33/4835; G01R 33/56325; G01R 33/56366; G01R 33/5676; G01R 33/38

See application file for complete search history.

(56) References Cited

U.S. PATENT DOCUMENTS 5,148,109 A * 9/1992 Takane .................. G01R 33/50
324/309
6,400,157 B1 * 6/2002 Bonanni ................. G01R 33/54
324/309

(Continued)

FOREIGN PATENT DOCUMENTS

JP    2010-142462 A    7/2010

*Primary Examiner* — Vinh Nguyen

(57) ABSTRACT

A method and an apparatus for adjusting the parameters of a magnetic resonance image are disclosed. An embodiment of the invention provides a method for adjusting a parameter at an imaging device that includes: (a) obtaining and storing MR (magnetic resonance) data; (b) calculating a constant by using the MR data; and (c) outputting a magnetic resonance image having a different contrast in real time, when a user manipulation is inputted, by using the constant and a parameter adjusted according to the manipulation.

15 Claims, 8 Drawing Sheets

(56) References Cited

U.S. PATENT DOCUMENTS

| | | | |
|---|---|---|---|
| 7,634,119 B2 * | 12/2009 | Tsougarakis | G01R 33/56 382/128 |
| 8,115,482 B2 * | 2/2012 | Hughes | A61B 5/055 324/306 |
| 8,148,981 B2 * | 4/2012 | Yui | G01R 33/561 324/307 |
| 2004/0015079 A1 * | 1/2004 | Berger | A61B 8/546 600/437 |
| 2014/0002077 A1 * | 1/2014 | Deshpande | G01R 33/56 324/309 |

* cited by examiner

METHOD AND APPARATUS FOR ADJUSTING THE PARAMETERS OF A MAGNETIC RESONANCE IMAGE

CROSS-REFERENCE TO RELATED APPLICATIONS

This application claims the benefit of Korean Patent Application No. 10-2014-0040128, filed with the Korean Intellectual Property Office on Apr. 3, 2014, and Korean Patent Application No. 10-2014-0043299, filed with the Korean Intellectual Property Office on Apr. 11, 2014, the disclosures of which are incorporated herein by reference in their entirety.

BACKGROUND

1. Technical Field

The present invention relates to a method and an apparatus for adjusting the parameters of a magnetic resonance image, more particularly to a method and apparatus with which the parameters of a magnetic resonance image can be easily altered during a diagnostic procedure using MRI.

2. Description of the Related Art

A magnetic resonance image (MRI) is an image that is obtained by having a person's body enter an apparatus equipped with a large magnet which generates a magnetic field, generating radio waves to resonate the nuclei of hydrogen atoms in a body part, measuring the differences in signals emitted from the respective tissues, and reconstructing the image with a computer.

That is, radio waves are emitted to the body from an apparatus equipped with a magnet, and as echo signals are obtained from the body, the echo signals are collected and converted into digital information for imaging.

Unlike X-ray radiography or CT scanning, which are tests that use X-rays, magnetic resonance imaging is a test method which uses radio waves of nonionizing radiation and thus provides the important advantage that it is essentially harmless to the human body. Using a magnetic field and radio waves of nonionizing radiation, which are harmless to the human body, magnetic resonance imaging provides a higher contrast for soft tissues in the body compared to CT scanning, even without the use of contrast agents, and provides information regarding the biochemical properties of tissues that contain hydrogen nuclei.

While it is similar to CT scanning in that cross-sections of the body can be obtained, magnetic resonance imaging can freely provide images along a desired direction, such as along a transverse direction, a longitudinal direction, a diagonal direction, etc., without requiring the patient to change posture, whereas a CT scan is generally focused on transverse cross-sections that show the body intersected laterally. A magnetic resonance image can be obtained via various techniques, the most well-known examples including T1 weighted imaging, T2 weighted imaging, FLAIR (fluid-attenuated inversion recovery), etc.

A T1 weighted image is an image that is obtained by a spin echo technique using a short TR (repetition time) and a short TE (echo time), where the image is obtained by a technique that reflects differences in T1 relaxation times as signal differences. When a short TR is used, the degrees of recovery of longitudinal magnetization may differ greatly between the tissues, and this may be reflected in the signals to obtain a T1 weighted image.

A T2 weighted image is an image that is obtained by a spin echo technique using long TR and TE, where the image is obtained by a technique that reflects the tissues' differences in T2 relaxation times as signal differences. When a long TR is used, the transverse magnetization decay may differ greatly between the tissues, and this may be reflected in the signals to obtain a T2 weighted image.

A FLAIR image is an image obtained by an inversion recovery technique that uses 180-degree inversion pulses.

A doctor may diagnose a patient's condition by using an image obtained from an imaging device according to any one of the various techniques (sequences) above.

However, the procedure here may entail diagnosing the patient using an image obtained by one MRI technique, and when insufficient, acquiring another image obtained by another technique, so that the patient may have to undergo repeated procedures of image capturing for different sequences for the diagnosis.

Recently, there has been research conducted on obtaining images that may be predicted when certain parameters (e.g. the TE and TR) are adjusted from MR data.

However, the image suited for diagnosing a patient may differ according to the condition of the patient, and it may be difficult for a doctor to predict which parameters need to be inputted in order to obtain a suitable image.

SUMMARY

An aspect of the invention is to provide a method and an apparatus for adjusting the parameters of a magnetic resonance image by way of which an image suitable for diagnosing a patient's illness can be obtained with a simple manipulation.

Also, an aspect of the invention is to provide a method and an apparatus for adjusting the parameters of a magnetic resonance image by way of which parameters can be easily altered using an intuitive interface such as a mouse pointer, and an image having a contrast level corresponding to the altered parameters can be provided in real time so as to provide an image needed for accurate diagnosis.

One aspect of the invention provides a method for adjusting a parameter at an imaging device that includes: (a) obtaining and storing MR (magnetic resonance) data; (b) calculating a constant by using the MR data; and (c) outputting a magnetic resonance image having a different contrast in real time, when a user manipulation is inputted, by using the constant and a parameter adjusted according to the manipulation.

The constant may be at least one of Mo (proton density), a T1 time constant, a T2 time constant, T2*, T1$\rho$, $\Delta$B1, $\Delta$B0, a diffusion coefficient, and susceptibility, and the parameter may include at least one of TR (repetition time), TE (echo time), TI, and FA (flip angle).

The user manipulation may include a position change of a mouse pointer, and the parameter may be adjusted when a position of the mouse pointer located in a particular area is changed.

The position of the mouse pointer may be associated with the parameter, and the magnetic resonance image may be outputted by using a parameter value corresponding to a particular position.

The x coordinate of the mouse pointer may be associated with a first parameter, and the y coordinate of the mouse may be associated with a second parameter, and the first parameter and the second parameter area may be adjusted according to the position of the mouse pointer.

The user manipulation may include sensing a movement of a mouse pointer, and the parameter may be adjusted based on the movement of the mouse pointer.

A left-right movement of the mouse pointer may be associated with a first parameter, and an up-down movement of the mouse pointer may be associated with a second parameter. The first parameter and the second parameter may be adjusted based on the movement of the mouse pointer.

The user manipulation may be inputted using a parameter control bar provided on a screen.

The user manipulation may include a touch action on a touch screen, and the parameter may be adjusted in correspondence to a touch position on the touch screen.

Another aspect of the invention provides a computer-readable recorded medium on which is recorded a program of instructions for performing the method described above.

Still another aspect of the invention provides an apparatus for adjusting a parameter of a magnetic resonance image that includes: an MR data storage unit configured to obtain and store MR data; a control unit configured to calculate a constant by using the MR data and generate a first magnetic resonance image corresponding to the MR data; and a display unit configured to output a diagnostic interface including the generated first magnetic resonance image, where the control unit provides control such that, when a user manipulation is inputted, a second magnetic resonance image having a different contrast is outputted in real time on the display unit by using the constant and a parameter adjusted according to the manipulation.

According to an embodiment of the invention, parameters can be altered easily by using a mouse, etc., to show magnetic resonance images of different contrast levels.

Additional aspects and advantages of the present invention will be set forth in part in the description which follows, and in part will be obvious from the description, or may be learned by practice of the invention.

DETAILED DESCRIPTION

Figure 1:
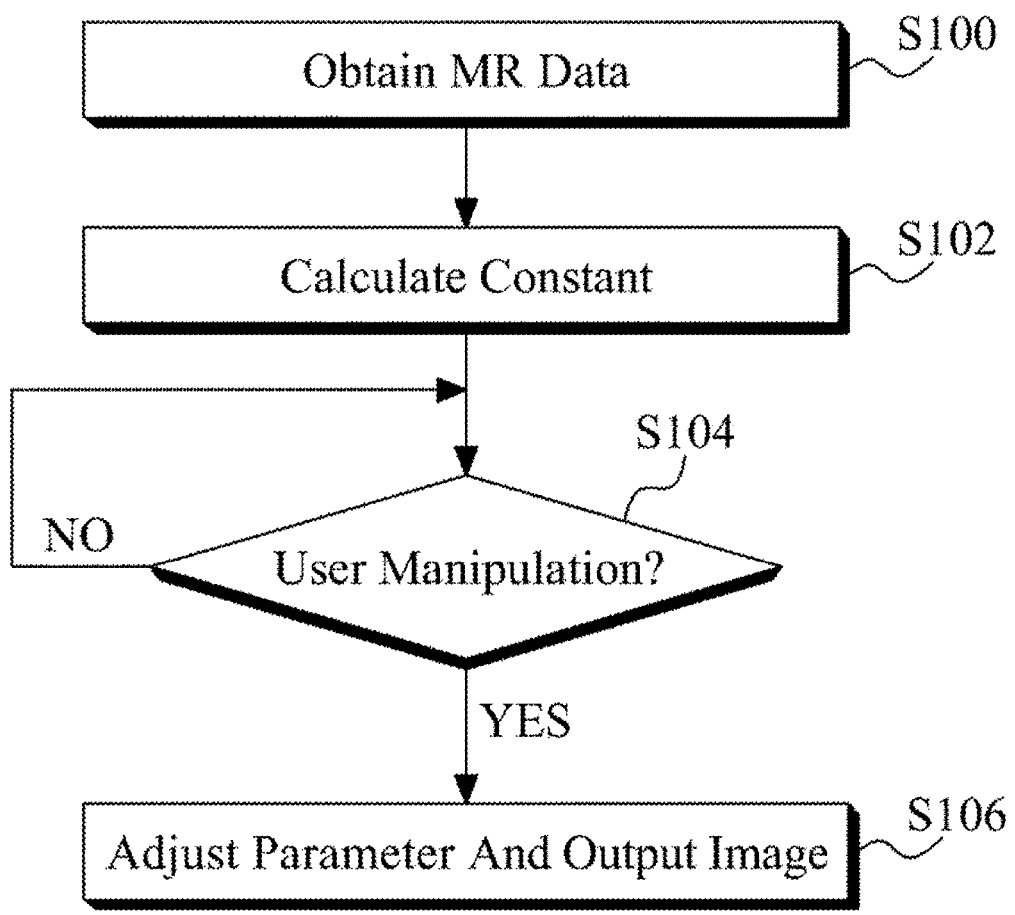
FIG. 1 is a flowchart of a process for adjusting a parameter of a magnetic resonance image according to an embodiment of the invention.

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the drawings, like reference numerals are used for like elements.

Certain embodiments of the invention will be described below in more detail with reference to the accompanying drawings. Those components that are the same or are in correspondence are rendered the same reference numeral regardless of the figure number, to aid the overall understanding of the invention.

FIG. 1 is a flowchart of a process for adjusting a parameter of a magnetic resonance image according to an embodiment of the invention.

The process illustrated in FIG. 1 can be performed at an imaging device that is capable of outputting a magnetic resonance image.

Referring to FIG. 1, MR (Magnetic Resonance) data may be obtained according to a particular technique (sequence) (operation 100).

Here, the MR data may be data related to signals that are generated during the relaxation after radio waves are applied with parameters corresponding to a particular radiography sequence.

It is possible to obtain a magnetic resonance image from the MR data in operation 100, and a multiple number of magnetic resonance images corresponding to the MR data can be obtained from the MR data.

Any of a variety of radiography sequences can be used in operation 100, and the obtained magnetic resonance image can be, but is not limited to, a T1 weighted image, a T2 weighted image, or a FLAIR image.

Afterwards, the imaging device may calculate a constant, such as T1 and T2, by using the obtained MR data (operation 102).

A magnetic resonance image may be obtained as hydrogen nuclei interact with a magnetic field and the absorption/emission patterns of the electromagnetic waves of a particular frequency are measured. In the case of an adult, about 60% of a person's weight is accounted for by bodily fluids, most of which is water. The nucleus of a hydrogen atom in water, i.e. a proton, spins in an arbitrary direction, and when placed in a strong magnetic field, the spin directions of the nuclei of some of the hydrogen atoms may be aligned with the direction of the magnetic field.

When radio wave pulses are applied in a vertical direction, the energy of the electromagnetic waves may be absorbed by the hydrogen nuclei to change the directions of the spin to an opposite direction of the magnetic field. When the pulses are stopped, the hydrogen nuclei having a reverse-direction spin may return to their original states, emitting weak electromagnetic waves in the process. By detecting these electromagnetic waves, the positions of the hydrogen nuclei from which the electromagnetic waves were emitted can be estimated, and an image can be formed.

The time it takes for a hydrogen nucleus having a reverse-direction spin to return to its original state (the relaxation time) can have the two values of T1 and T2 according to the cause of relaxation of the spin.

The relaxation caused by an interaction between the spin of a hydrogen nucleus and the spin of a nearby hydrogen nucleus is referred to as spin-spin relaxation, and the time constant associated with this is referred to as T2.

On the other hand, the relaxation caused by an interaction between the spin and the lattice structure of the surrounding tissue is referred to as spin-lattice relaxation, and the time constant associated with this is referred to as T1.

Figure 2:
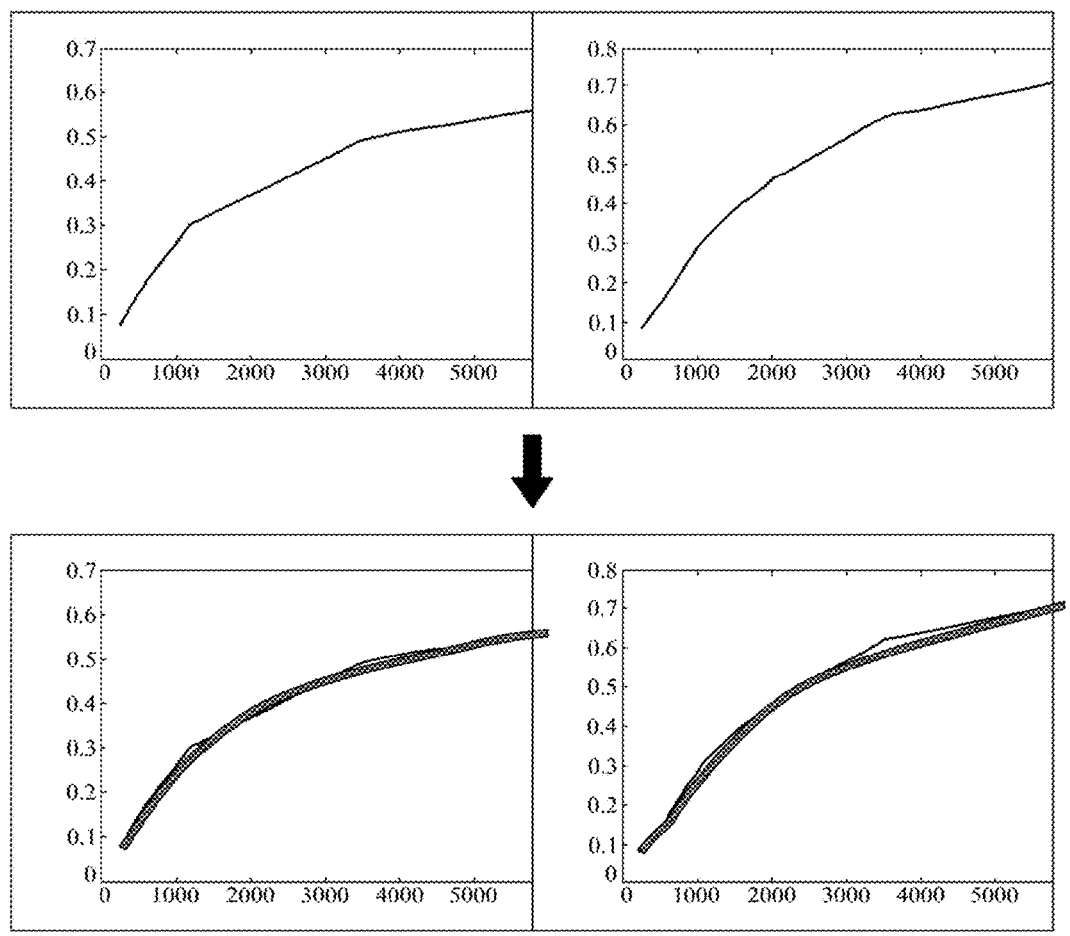
FIG. 2 shows graphs illustrating a process for obtaining T1 and T2 by an exponent adjustment of relaxation data.

FIG. 2 shows graphs illustrating a process for obtaining T1 and T2 by an exponent adjustment of relaxation data.

In the graphs illustrated in FIG. 2, the x-axis corresponds to time, and the y-axis represents the intensity of an MR signal.

Referring to the graphs in the upper part of FIG. 2, as the relaxation signals (MR data) obtained by way of a particular sequence take the form of exponents, the quantitative values of T1 and T2 can be obtained by fitting, as shown in the graphs in the lower part of FIG. 2.

However, the method illustrated in FIG. 2 cannot provide the values of T1 and T2, etc., at the same time. Several sheets of data may be needed to obtain the exponential curve, for which a multiple number of magnetic resonance images may be obtained from the MR data in operation 100.

$$I(x, y) = M_0(x, y)\exp\left(-\frac{TE}{T_2(x, y)}\right)\left\{1 - \exp\left(-\frac{TR}{T_1(x, y)}\right)\right\} \quad \text{[Equation 1]}$$

Here, x, y are voxel indices representing the position of a voxel, TE is echo time, TR is repetitive time, and Mo(ρ) is proton density (the content of water in a particular tissue).

From Equation 1 shown above, constants such as T1, T2, and Mo (proton density, ρ) can be calculated.

Other constants, such as delB B0(ΔB0), ΔB1, the diffusion coefficient and susceptibility, T2* (free induction decay rate), T1ρ, etc., can be obtained from Equation 2 and Equation 3 shown below.

$$I(x, y) = \quad \text{[Equation 2]}$$

$$M_0(x, y) \times \left\{1 - 2\times\exp\left(-\frac{TI}{T_1(x, y)}\right) + \exp\left(-\frac{TR}{T_1(x, y)}\right)\right\} \times$$

$$\exp\left(-\frac{TE}{T_2(x, y)}\right)$$

Here, $TI = -T_1 \times \ln\left\{\frac{1 + \exp(-TR/T_1)}{2}\right\}$

Equation 2 is an equation relating to the signals acquired when obtaining an image with sequences known as FLAIR and STIR, and becomes the same as Equation 1 when TI (inversion time)=0, TI being the time interval between a 180-degree RF pulse and a 90-degree RF pulse in a suppression sequence.

$$I(x, y) = M_0(x, y)\sin(FA) \quad \text{[Equation 3]}$$

$$\sqrt{E_2(x, y)} \frac{1 - E_1(x, y)}{1 - E_1(x, y)E_2(x, y) - (E_1(x, y) - E_2(x, y))\cos(FA)}$$

$$E_1(x, y) = \exp\left(-\frac{TR}{T_1(x, y)}\right)$$

Here, FA (flip angle) is the angle by which the magnetization is rotated to the transverse plane.

$$\text{[Equation 4]}$$

$$I(x, y) = \sqrt{(Me(1)^2 + Me(2)^2)} \times \exp(i(Me(1) + iMe(2))) \times \exp(i\, B_1(x, y))$$

$$A(x, y) = \begin{bmatrix} \exp(-TE/T_1(x, y)) & 0 & 0 \\ 0 & \exp(-TE/T_1(x, y)) & 0 \\ 0 & 0 & \exp(-TE/T_1(x, y)) \end{bmatrix}$$

$$B(x, y) = \begin{bmatrix} \exp(-TE/T_1(x, y)) \\ 0 \\ 0 \end{bmatrix}$$

$$R_z(\theta) = \begin{bmatrix} \cos\theta & -\sin\theta & 0 \\ \sin\theta & \cos\theta & 0 \\ 0 & 0 & 1 \end{bmatrix}$$

$$R_z(\theta) = \begin{bmatrix} \cos\theta & 0 & -\sin\theta \\ 0 & 1 & 0 \\ \sin\theta & 0 & \cos\theta \end{bmatrix}$$

$$Me = A \times R_z(2\pi \times \Delta B_0(x, y) \times TR/2) \times$$
$$(R_y(FA \times |B_1(x, y)|) \times M_0(x, y)) + B(x, y) \times M_0(x, y)$$

Me is a 3×1 vector, where Me(1) is the first component, and Me(2) is the second component.

Here, ΔB0 is the B0 inhomogeneity, a parameter representing the inhomogeneity of B0, and ΔB1 is the B1 inhomogeneity, a parameter representing the inhomogeneity of B1. Also, the diffusion coefficient is a diffusion coefficient of protons (water) moving within a tissue, and the susceptibility is a value representing the degree to which an object is magnetized in an MRI.

T1ρ is defined as the spin-lattice relaxation time constant in the rotating frame.

T1ρ imaging may be used for checking proton absence, Alzheimer's disease, lipid fluidity, etc.

The constants such as T1 and T2 may be used for generating magnetic resonance images having different contrasts in real time.

While the above illustrates an embodiment of the invention that involves calculating constants such as T1 and T2 by using Equation 1 through Equation 4 as an example, it would be apparent to those skilled in the art that the constants such as T1 and T2 can be calculated by using other equations and algorithms.

After the constants such as T1 and T2 are calculated as above, the imaging device may determine whether or not a manipulation is made by the user (doctor) (operation 104). Here, the manipulation refers to a manipulation made to change a parameter for obtaining a magnetic resonance image of a different contrast. The parameter can include a TE parameter and a TR parameter, for example, and it would be apparent to those skilled in the art that other parameters can be adjusted additionally.

According to the user's manipulation, one or more parameter may be adjusted, and an image having a contrast corresponding to the adjusted parameter may be outputted in a particular area of the diagnostic interface (operation 106).

According to an embodiment of the invention, the adjusting of a parameter can be achieved by a mouse manipulation made by the user. For example, the x coordinate of a mouse pointer can be associated with a first parameter (e.g. TE), while the y coordinate can be associated with a second parameter (e.g. TR), and a magnetic resonance image to which the parameters are applied in correspondence to the position of the mouse pointer may be outputted in a particular area of the diagnostic interface. The image having the new parameters applied can be outputted in real time. If the constants such as T1 and T2 are known, the image can be expressed as formulas of a closed form, such as Equation 1 through Equation 4, so that an image of a different contrast to which the new parameters are applied can be outputted in real time.

The user can change the position of the mouse pointer by a simple movement of the mouse. Since the position of the mouse pointer is associated with the parameters, the parameters may change continuously as the user moves the position of the mouser pointer from a first point to a second point, and the user can see the continuously changing image in real time.

It becomes possible for a doctor to continuously change the parameters according to the mouse manipulation and obtain an image that has a level of contrast that can accurately express the information needed for the final diagnosis. In particular, an accurate diagnosis can require images of various contrasts, and with an embodiment of the invention, the images of various contrast levels needed for diagnosis can be easily obtained.

Figure 3:
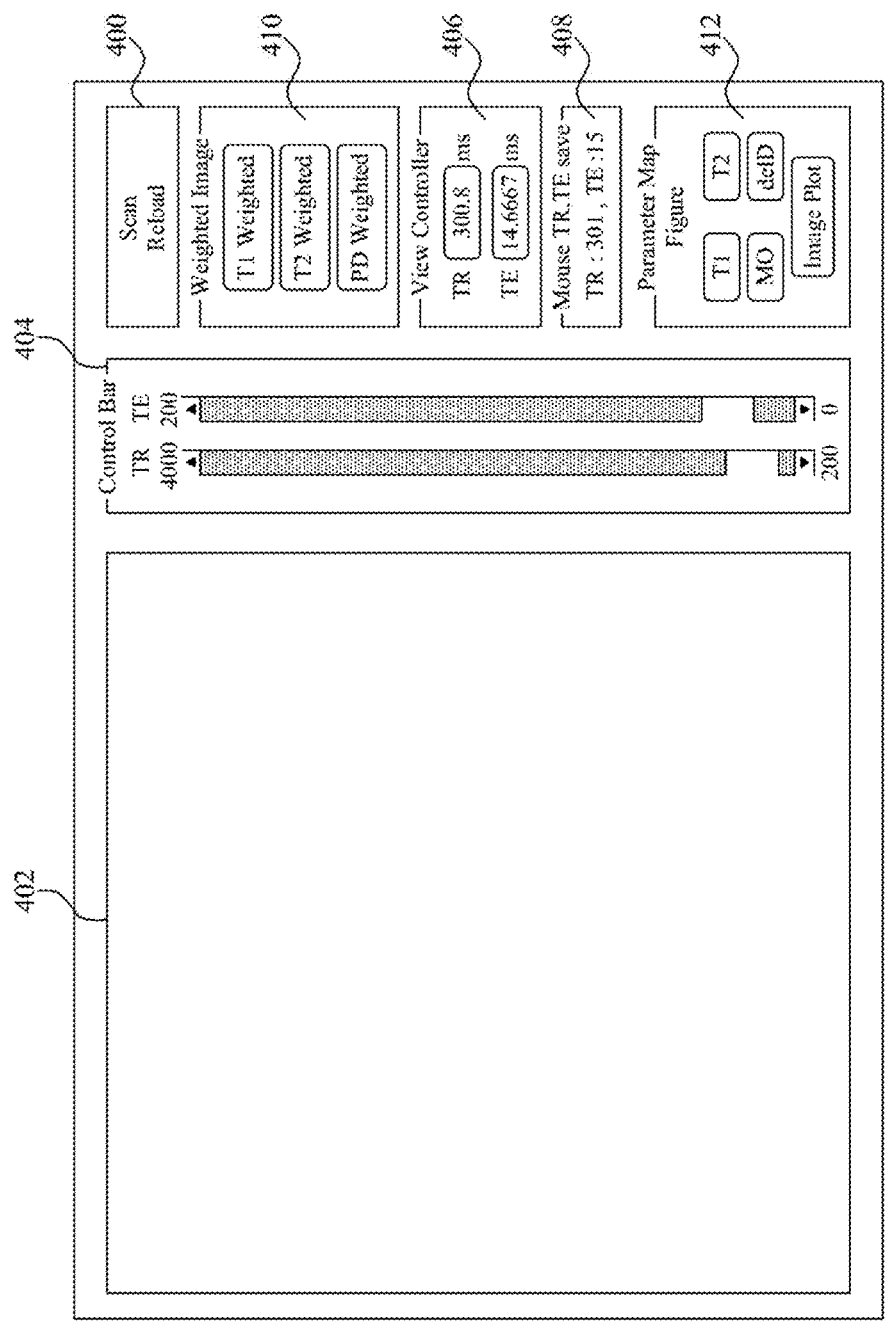
FIG. 3 illustrates a diagnostic interface outputted at an imaging device according to an embodiment of the invention.

FIG. 3 illustrates a diagnostic interface outputted at an imaging device according to an embodiment of the invention.

As illustrated in FIG. 3, the diagnostic interface according to an embodiment of the invention can include an image loading menu 400, an image output area 402, a parameter control bar 404, a parameter adjustment window 406, a stored parameter indicator area 408, an image selection menu 410, and a calculated parameter menu 412.

When the user selects the image loading menu 400, a magnetic resonance image corresponding to the MR data obtained through a particular sequence may be outputted in the image output area 402. As described above, a multiple number of magnetic resonance images corresponding to the MR data can be obtained, and the outputted image can be just one of these images or a multiple number of magnetic resonance images outputted together.

In the image output area 402, a magnetic resonance image obtained by way of a preconfigured TR and TE can be outputted, and the constants such as T1 and T2 can be calculated in a corresponding sequence.

According to an embodiment of the invention, when a manipulation is made by the user, the parameters such as TR and TE may be adjusted and the magnetic resonance image generated by using the adjusted parameters and previously calculated constants can be outputted in the image output area 402.

Preferably, the adjustment of parameters according to an embodiment of the invention can be achieved by way of a manipulation on a mouse.

The descriptions that follow will focus on outputting images of different contrast levels by adjusting the TR and TE from among multiple parameters.

According to an embodiment of the invention, the parameters can be adjusted conveniently according to a left click or a right click on the buttons of a mouse as well as the movement of the mouse.

For example, when the mouse pointer is positioned in the image output area 402 while the right click button is being pressed, an image can be outputted to which the TR and TE associated with the corresponding position are applied. As described above, the x coordinate of the pointer may be associated with TR, and the y coordinate may be associated with TE for adjusting the parameters with a movement of the pointer. Of course, it would be acceptable to have the pointer moved without pressing on the right click button.

Since the movement of the pointer of the mouse is made continuously, the doctor is able to check the image with the continuously changing parameters in real time and find the image that is the most suitable, and of course can find multiple images needed for diagnosis.

According to another embodiment of the invention, the parameters can be adjusted by using the movement of the mouse pointer. For example, if a movement in the left-right direction is detected, the TE parameter can be adjusted based on the direction and extent of the movement. Also, if a movement in the up-down direction is detected, the TR parameter can be adjusted based on the direction and extent of the movement. In one example, the parameter adjustment can be implemented such that the TE parameter is gradually decreased if a movement of the mouse pointer in the left direction is detected and the TE parameter is gradually increased if a movement of the mouse pointer in the right direction is detected.

If there is a parameter adjustment in accordance with a mouse manipulation, the parameters at the current position of the mouse may be shown on the parameter control bar 404 and in the parameter adjustment window 406.

According to another embodiment of the invention, the parameter adjustment can be implemented based not on the mouse manipulation but on a TR and TE adjustment on the parameter control bar 404 or a user's input of the TR and TE in the parameter adjustment window 406.

According to an embodiment of the invention, if a user makes a manipulation on the mouse while pressing on the right click button and then presses the left click button, the current parameter values may be saved.

That is, according to an embodiment of the invention, an input on a first button equipped on the mouse can be assigned to adjust a parameter, while an input on a second button can be assigned to store the parameter.

The parameters stored in this manner may be outputted in the stored parameter indicator area 408.

Also, the magnetic resonance image corresponding to the currently stored parameters may be outputted in the image display area 402.

While the above describes adjusting the two parameters of TR and TE based on a movement of the mouse in a left-right direction or an up-down direction, it is possible to adjust additional parameters by way of a manipulation part (buttons) with which the mouse may be additionally provided, if there are more parameters for adjusting.

The additional parameters can include the TI parameter or FA (flip angle), in addition to TR and TE. STIR and FLAIR are used for viewing tissues with the CSF and fat portions excluded, and in the sequence used for viewing only those tissues that are helpful for the diagnosis, the TI parameter may be used.

Furthermore, additional buttons other than a right click button and a left click button can be provided on the mouse, and the user can be allowed to adjust a parameter by pressing one of the additional buttons or moving the mouse in a left-right direction or an up-down direction while pressing one of the additional buttons.

The above describes a method of adjusting a parameter by using a mouse or an input window. However, a doctor may wish to obtain a primarily obtained magnetic resonance image and a magnetic resonance image based on another sequence only, instead of various images to which various parameters have been applied. For example, if the images obtained in operation 100 of FIG. 2 are images obtained according to a first sequence, the doctor may desire only a predictive image that would be obtained according to a second sequence.

In this case, a desired image can be obtained by using the sequence selection menu 410 illustrated in FIG. 3.

For example, if the primarily obtained images are images obtained according to a T1 weighted sequence and the doctor desires predictive images based on a particular T2 weighted sequence, then the doctor can select the particular T2 weighted sequence from the sequence selection menu 410. As the parameters, such as TR and TE, etc., for the particular T2 weighted sequence are set beforehand, the doctor is able to check a predictive image corresponding to the particular T2 weighted sequence from the image output area 402.

Figure 4:
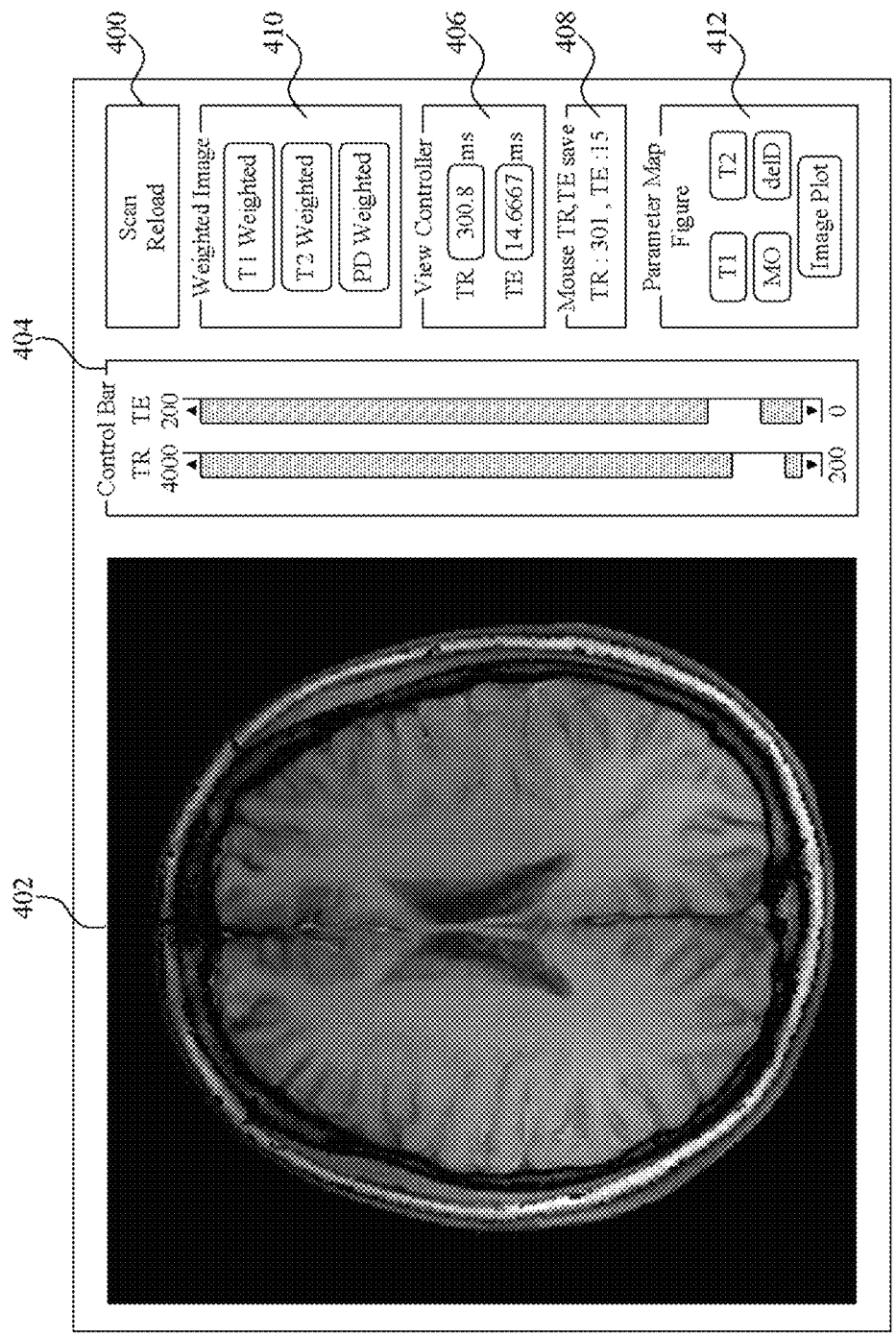
FIG. 4 and FIG. 5 are magnetic resonance images of different contrasts outputted through a diagnostic interface according to an embodiment of the invention.
Figure 5:
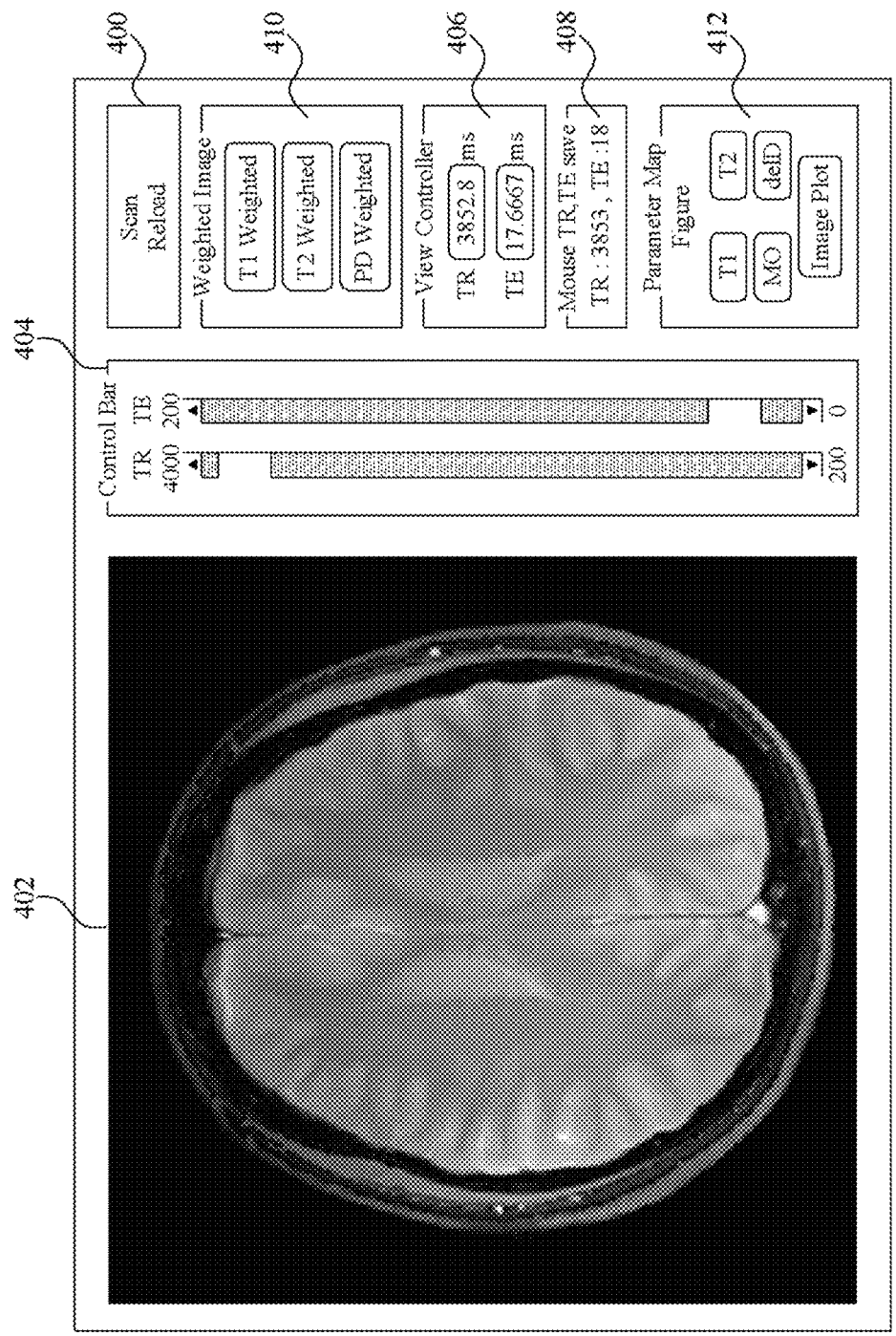

FIG. 4 and FIG. 5 are magnetic resonance images of different contrasts outputted through a diagnostic interface according to an embodiment of the invention.

FIG. 4 illustrates a magnetic resonance image outputted with TR adjusted to 300.8 ms and TE adjusted to 14.6667 ms, and FIG. 5 illustrates a magnetic resonance image outputted with TR adjusted to 3852.8 ms and TE adjusted to 17.6667 ms.

As illustrated in FIG. 4 and FIG. 5, the parameters can be easily adjusted with a diagnostic interface based on the present embodiment, by way of which magnetic resonance images having different contrasts can be easily viewed.

Figure 6:
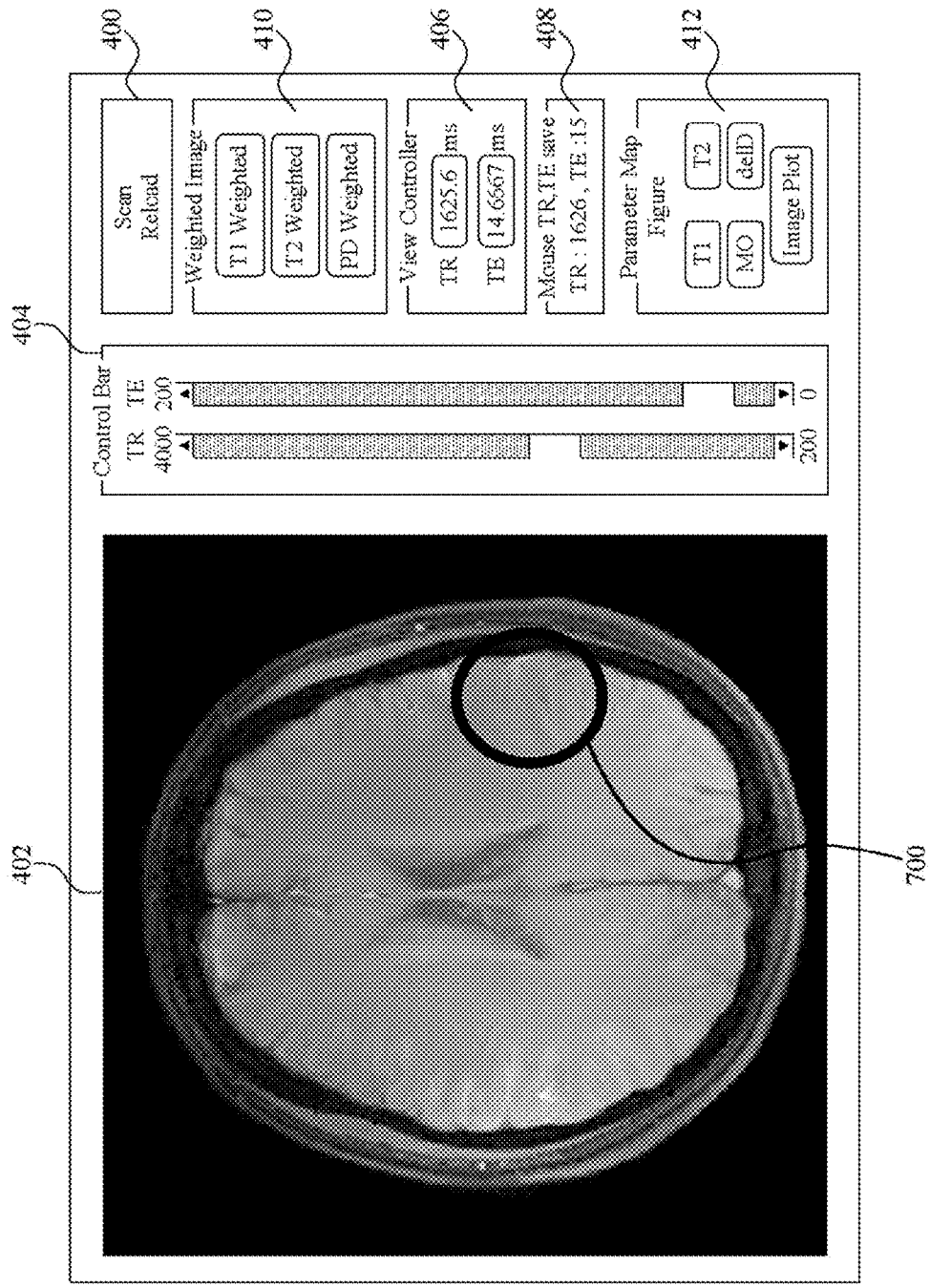
FIG. 6 and FIG. 7 illustrate a process of distinguishing a type of tissue with images of different contrasts.
Figure 7:
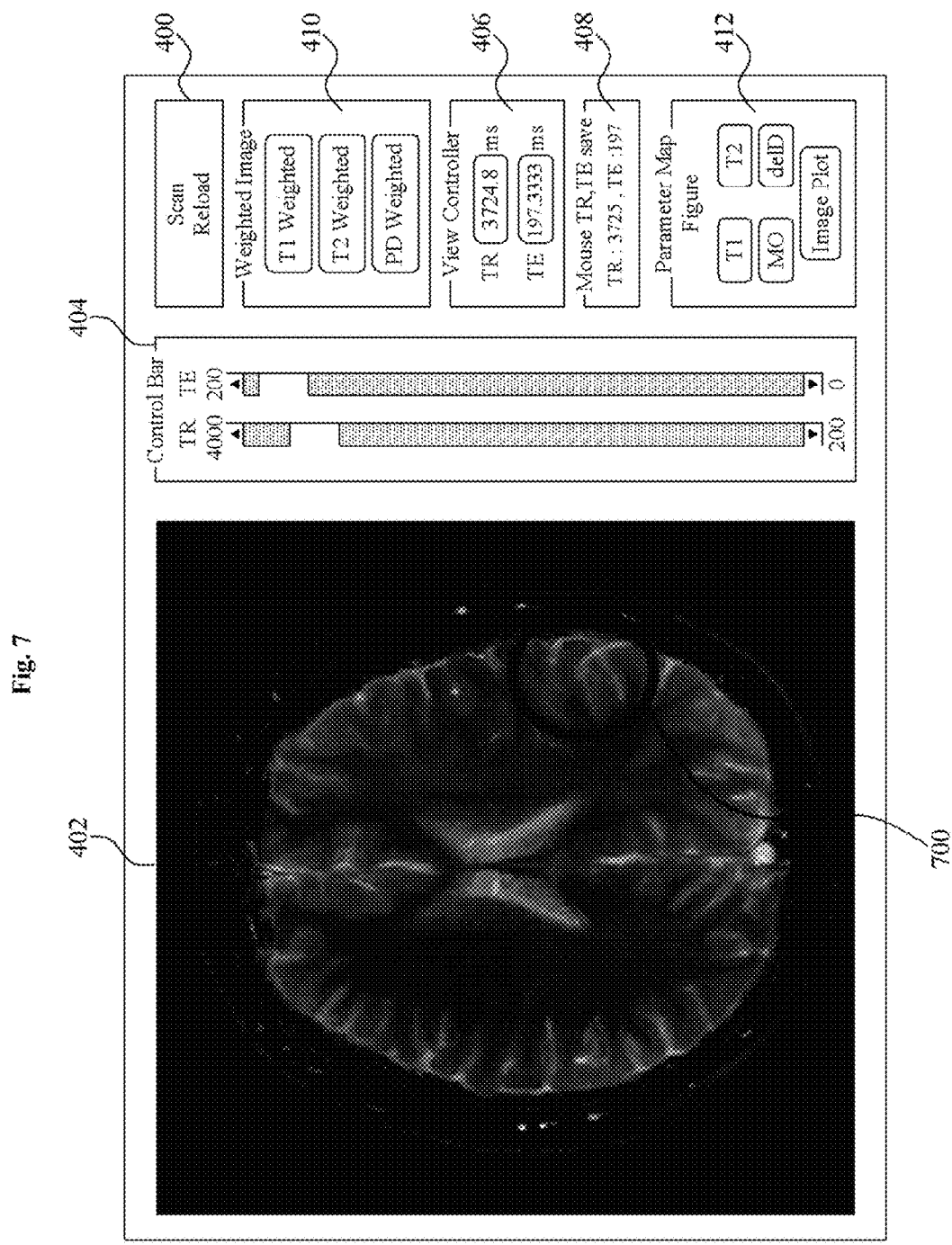

FIG. 6 and FIG. 7 illustrate a process of distinguishing a type of tissue with images of different contrasts.

FIG. 6 illustrates a magnetic resonance image outputted with TR adjusted to 1625.6 ms and TE adjusted to 14.6667 ms, and FIG. 7 illustrates a magnetic resonance image outputted with TR adjusted to 3724.8 ms and TE adjusted to 197.3333 ms.

Referring to FIG. 6 and FIG. 7, in the magnetic resonance image of the FIG. 6, the tissue inside the circle 700 cannot be distinguished, but by adjusting the parameters and outputting a magnetic resonance image such as that shown in FIG. 7, the tissue inside the circle 700 can be distinguished.

Thus, when a diagnostic interface according to an embodiment of the invention is used, the condition of the patient can be diagnosed accurately, by easily changing the contrast, without having to capture additional images.

Figure 8:
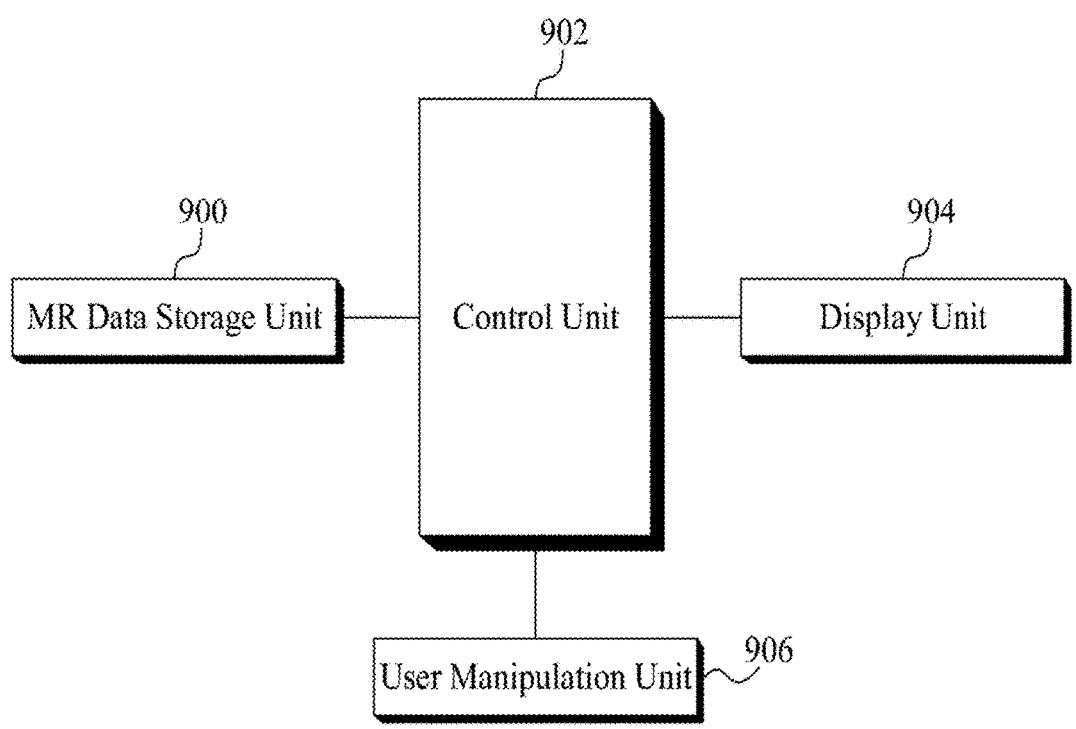
FIG. 8 is a block diagram illustrating the composition of an imaging device according to an embodiment of the invention.

FIG. 8 is a block diagram illustrating the composition of an imaging device according to an embodiment of the invention.

As illustrated in FIG. 8, an imaging device according to an embodiment of the invention can include an MR data storage unit 900, a control unit 902, a display unit 904, and a user manipulation unit 906.

The MR data storage unit 900 may store the MR data obtained by way of a particular sequence.

The control unit 902 may calculate constants such as the parameters T1 and T2 of the MR data stored in the MR data storage unit 900.

The calculated constants may be stored beforehand.

Also, the control unit 902 may provide control such that the diagnostic interface including an image output area, etc., such as that shown in FIG. 4, is outputted on the display unit 904 when there is such a request from the user.

The display unit 904 may output a magnetic resonance image generated using the MR data stored in the MR data storage unit 900 in the image output area 402 when a selection is made by the user on the image loading menu 400 or when there is a request for loading data.

The control unit 902 according to this embodiment may provide control such that the parameters are adjusted according to input signals from the user manipulation unit 906 and a magnetic resonance image corresponding to the adjusted parameters is outputted.

The user manipulation unit 906 according to the present embodiment can be a mouse, and the parameters can be adjusted by way of inputs on buttons equipped on the mouse and the movement of the mouse.

However, the present invention is not limited to the above, and if the display unit 904 is provided as a touch screen, the parameters can also be adjusted in accordance to a touch manipulation by the user.

For example, if the user moves in a left-right direction during a touch input, the TE parameter can be adjusted, and if the user moves in an up-down direction during a touch input, the TR parameter can be adjusted.

Also, if the user touches the screen with one hand and moves in a left-right direction or an up-down direction during a touch with the other hand, the parameters can be adjusted correspondingly.

The embodiments of the present invention can be implemented in the form of program instructions that may be performed using various computer means and can be recorded in a computer-readable medium. Such a computer-readable medium can include program instructions, data files, data structures, etc., alone or in combination. The program instructions recorded on the medium can be designed and configured specifically for the present invention or can be a type of medium known to and used by the skilled person in the field of computer software. Examples of a computer-readable medium may include magnetic media such as hard disks, floppy disks, magnetic tapes, etc., optical media such as CD-ROM's, DVD's, etc., magneto-optical media such as floptical disks, etc., and hardware devices such as ROM, RAM, flash memory, etc. Examples of the program of instructions may include not only machine language codes produced by a compiler but also high-level language codes that can be executed by a computer through the use of an interpreter, etc. The hardware mentioned above can be made to operate as one or more software modules that perform the actions of the embodiments of the invention, and vice versa.

While the present invention has been described above using particular examples, including specific elements, by way of limited embodiments and drawings, it is to be appreciated that these are provided merely to aid the overall understanding of the present invention, the present invention is not to be limited to the embodiments above, and various modifications and alterations can be made from the disclosures above by a person having ordinary skill in the technical field to which the present invention pertains. Therefore, the spirit of the present invention must not be limited to the embodiments described herein, and the scope of the present invention must be regarded as encompassing not only the claims set forth below, but also their equivalents and variations.

What is claimed is:

1. A method for adjusting a parameter at an imaging device, the method comprising:
   obtaining and storing MR (magnetic resonance) data;
   calculating a constant by using the MR data; and
   outputting a magnetic resonance image having a different contrast in real time by a user manipulation,
   wherein the user manipulation includes a position change of a mouse pointer,
   wherein an x coordinate of the mouse pointer is associated with a first parameter and a y coordinate of the mouse pointer is associated with a second parameter,
   wherein, when a user changes the position of the mouse pointer by moving the mouse pointer, the parameters associated with the position of mouse pointer change continuously and the imaging device outputs continuously changing magnetic resonance images corresponding to the parameters.

2. The method of claim 1, wherein the constant is at least one of Mo (proton density), a T1 time constant, a T2 time constant, T2*, T1ρ, ΔB1, ΔBo, a diffusion coefficient, and susceptibility, and the parameter includes at least one of TR (repetition time), TE (echo time), TI, and FA (flip angle).

3. The method of claim 1, wherein the user manipulation is inputted using a parameter control bar provided on a screen.

4. The method of claim 1, wherein the user manipulation includes a touch action on a touch screen, and the parameters are adjusted in correspondence to a touch position on the touch screen.

5. A computer-readable recorded medium having recorded thereon and tangibly embodying a program of instructions for performing the method of claim 1.

6. The method of claim 1, wherein the first parameter is TE (echo time) and the second parameter is TR (repetition time), wherein if a movement of the mouse pointer in left to right direction is detected, a value of TE parameter is gradually adjusted based on the direction and extent of the movement, wherein if a movement of the mouse pointer in up to down direction is detected, a value of TR parameter is gradually adjusted based on the direction and extent of the movement.

7. The method of claim 1, wherein a first button of the mouse is assigned to adjust parameters and a second button of the mouse is assigned to store parameters, wherein if the user clicks the second button while pressing on the first button, current parameter values are stored.

8. The method of claim 1, wherein a third parameter is adjusted when the user moves the mouse pointer while pressing on a button of the mouse.

9. An apparatus for adjusting a parameter of a magnetic resonance image, the apparatus comprising:
an MR(magnetic resonance) data storage unit configured to obtain and store MR data;
a control unit configured to calculate a constant by using the MR data and generate a first magnetic resonance image corresponding to the MR data; and
a display unit configured to output a diagnostic interface including the generated first magnetic resonance image,
wherein the control unit provides control such that, when a user manipulation is inputted, a second magnetic resonance image having a different contrast is outputted in real time on the display unit,
wherein the user manipulation includes a position change of a mouse pointer,
wherein an x coordinate of the mouse pointer is associated with a first parameter and a y coordinate of the mouse pointer is associated with a second parameter,
wherein, when a user changes the position of the mouse pointer by moving the mouse pointer, the parameters associated with the position of mouse pointer change continuously and the imaging device outputs continuously changing magnetic resonance images corresponding to the parameters.

10. The apparatus of claim 9, wherein the constant is at least one of Mo (proton density), a T1 time constant, a T2 time constant, T2*, T1ρ, ΔB1, ΔBo, a diffusion coefficient, and susceptibility, and the parameter includes at least one of TR (repetition time), TE (echo time), TI, and FA (flip angle).

11. The apparatus of claim 9, wherein the user manipulation is inputted using a parameter control bar provided on a screen.

12. The apparatus of claim 9, wherein the user manipulation includes a touch action on a touch screen, and the parameters are adjusted in correspondence to a touch position on the touch screen.

13. The apparatus of claim 9, wherein the first parameter is TE (echo time) and the second parameter is TR (repetition time), wherein if a movement of the mouse pointer in left to right direction is detected, a value of TE parameter is gradually adjusted based on the direction and extent of the movement, wherein if a movement of the mouse pointer in up to down direction is detected, a value of TR parameter is gradually adjusted based on the direction and extent of the movement.

14. The apparatus of claim 9, wherein a first button of the mouse is assigned to adjust parameters and a second button of the mouse is assigned to store parameters, wherein if the user clicks the second button while pressing on the first button, current parameter values are stored.

15. The apparatus of claim 9, wherein a third parameter is adjusted when the user moves the mouse pointer while pressing on a button of the mouse.

* * * * *